(12) United States Patent
Melanson

(10) Patent No.: US 7,212,874 B2
(45) Date of Patent: May 1, 2007

(54) NOISE-SHAPERS AND FILTERS WITH NOISE SHAPING QUANTIZERS AND SYSTEMS AND METHODS USING THE SAME

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 167 days.

(21) Appl. No.: 10/397,556

(22) Filed: Mar. 26, 2003

(65) Prior Publication Data

US 2004/0190728 A1 Sep. 30, 2004

(51) Int. Cl.
*G06F 17/00* (2006.01)
*H03M 3/00* (2006.01)

(52) U.S. Cl. .......................................... 700/94; 341/143
(58) Field of Classification Search ................... 700/94; 327/554; 381/99; 341/139, 143, 126
See application file for complete search history.

(56) References Cited

U.S. PATENT DOCUMENTS

| | | | | |
|---|---|---|---|---|
| 5,068,661 A | * | 11/1991 | Kaneaki et al. | 341/143 |
| 5,311,181 A | * | 5/1994 | Ferguson et al. | 341/143 |
| 5,598,158 A | * | 1/1997 | Linz | 341/143 |
| 5,757,299 A | * | 5/1998 | Noro et al. | 341/143 |
| 5,821,889 A | * | 10/1998 | Miller | 341/139 |
| 2003/0201922 A1 | * | 10/2003 | Dagher et al. | 341/143 |

* cited by examiner

*Primary Examiner*—Sinh Tran
*Assistant Examiner*—Daniel R. Sellers
(74) *Attorney, Agent, or Firm*—Thompson & Knight LLP; James J. Murphy

(57) ABSTRACT

A noise shaping system including an inner loop and outer noise shaping loops. The inner noise shaping loop includes an inner loop filter and a quantizer for quantizing an output of the inner loop filter. The outer noise shaping loop includes an outer loop filter having an input receiving feedback from the quantizer of the inner noise shaping loop and an output driving an input of the inner loop filter of the inner noise shaping loop.

20 Claims, 8 Drawing Sheets

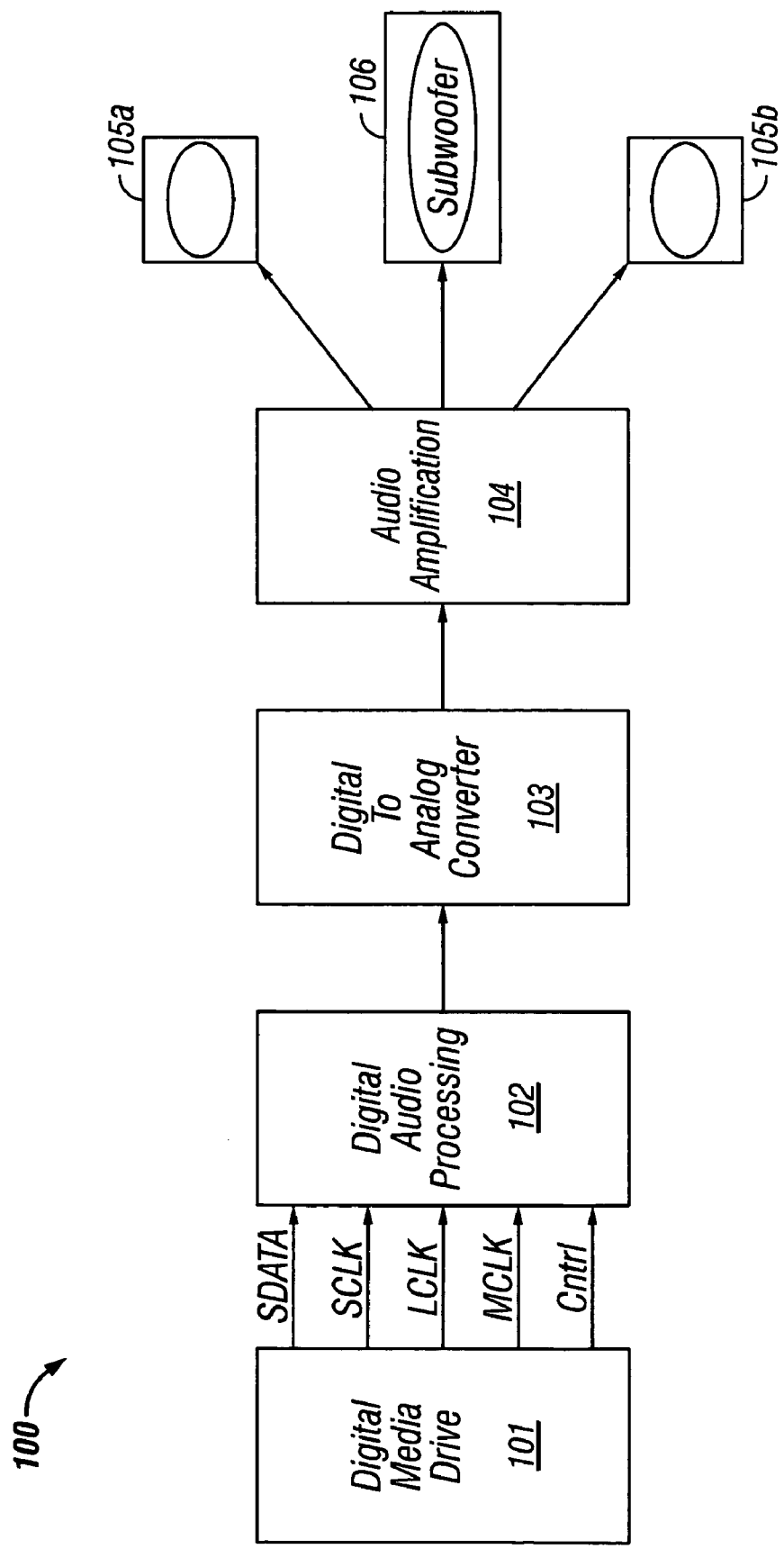

NOISE-SHAPERS AND FILTERS WITH NOISE SHAPING QUANTIZERS AND SYSTEMS AND METHODS USING THE SAME

FIELD OF INVENTION

The present invention relates in general to digital filtering and noise shaping and in particular to noise-shapers and filters with noise shaping quantizers and systems and methods using the same.

BACKGROUND OF INVENTION

The Super Audio Compact Disk (SACD) system records audio data on an optical disk as a single-bit digital stream at a high oversampling rate. This high oversampling rate advantageously extends the signal bandwidth well beyond the range of human audibility and reduces the need for significant anti-aliasing filtering. Consequently, audible time-domain effects, which normally result when steep low-pass anti-aliasing filters are used in traditional digital audio systems, are typically no longer a significant problem in SACD systems.

The advantages provided by the high oversampling rate of the SACD bit stream are countered to a certain degree by the significant disadvantages of the one-bit data format. For example, to maintain a large dynamic range in the audio band using one-bit data, the noise must be shifted out of the audio band with a noise transfer function having a relatively steep passband edge. Delta-sigma modulators are commonly utilized in SACD systems to generate such a noise transfer function, although conventional delta-sigma modulators are normally insufficient for some advanced audio applications.

Increasingly, SACD systems are being integrated into audio systems, such as those found in home theater systems, which utilize a set of main speakers without an extended bass response and a subwoofer which provides the remaining low frequency bass output. The task of splitting and directing the bass and higher frequency responses to the appropriate speakers in such a system is difficult when highly oversampled data, such as SACD data, is being processed. Ideally, the crossover and mixing required to make the frequency split would be done at the full SACD oversampling rate to realize the advantages of highly oversampled data discussed above. Filtering highly oversampled data however normally requires performing highly accurate multiplications on digital data words of significantly long length.

Hence, some new techniques are required for processing highly oversampled audio data, such as SACD data, which support applications such as home theater audio while at the same time being relatively simple and inexpensive to implement.

SUMMARY OF INVENTION

The principles of the present invention are generally embodied in filters and noise shaping systems that include a noise shaping quantizer at the output. According to one particular embodiment, a noise shaping system includes an inner noise and outer noise shaping loops. The inner noise shaping loop includes an inner loop filter and a quantizer for quantizing an output of the inner loop filter. The outer noise shaping loop includes an outer loop filter having an input receiving feedback from the quantizer of the inner noise shaping loop and an output driving an input of the inner loop filter.

In delta-sigma modulator applications, a noise shaping quantizer at the output allows out-of-band quantization noise to be shifted further out-of-band. Additionally, by noise shaping the quantizer output, the number of bits in the delta-sigma feedback loop is also advantageously reduced. In filter applications, such as IIR filters, a noise shaping quantizer is used according to the inventive principles to minimize the coefficient multiplier circuits. Consequently, both lowpass and highpass filters, suitable for applications such as audio crossover filters, may be constructed relatively simply and inexpensively. In sum, the principles of the present invention are useful when digital filters are required to operate on highly oversampled data with a sampling rate of approximately eight (8) or more times the signal bandwidth.

BRIEF DESCRIPTION OF DRAWINGS

For a more complete understanding of the present invention, and the advantages thereof, reference is now made to the following descriptions taken in conjunction with the accompanying drawings, in which:

FIG. 1 is high level block diagram of an exemplary audio system suitable for practicing the present inventive principles;

DETAILED DESCRIPTION OF THE INVENTION

Figure 2A:
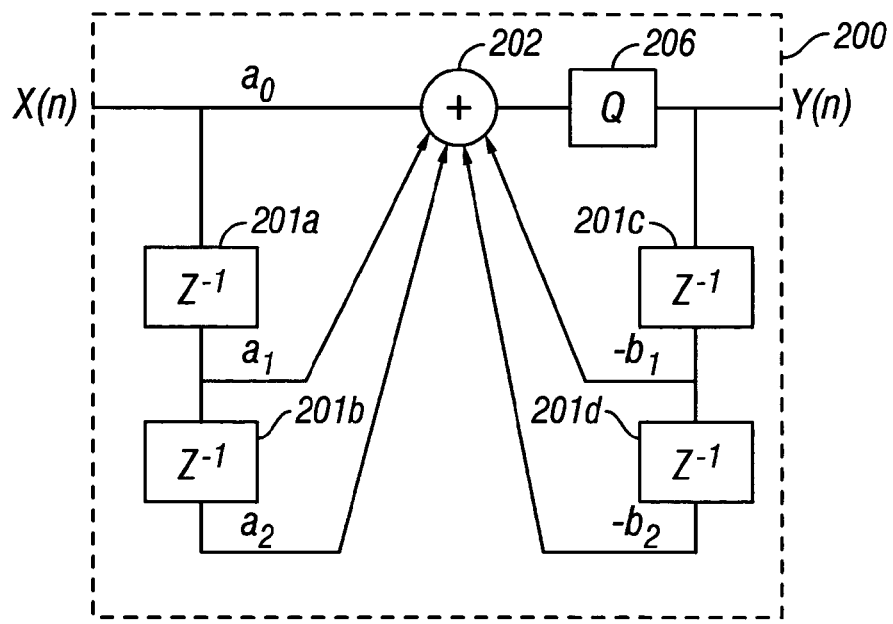
FIG. 2A is a block diagram of a generalized direct form infinite impulse response (IIR) filter.

The principles of the present invention and their advantages are best understood by referring to the illustrated embodiment depicted in FIGS. 1–7 of the drawings, in which like numbers designate like parts.

FIG. 1 is a diagram of an exemplary digital audio system 100 according to the principles of the present invention. Advantageously, system 100 processes digital audio input data in the digital domain prior to conversion to analog form, as discussed in detail below.

Audio data are recovered from the associated digital audio storage media by a digital media drive 101, such as a compact disk (CD) player, digital audio tape (DAT) player, or digital versatile disk (DVD) unit. In the illustrated embodiment, the recovered audio data are a one-bit data stream in the Sony/Philips Super Audio Compact Disk (SACD) format. In alternate embodiments, the audio data are in a multiple-bit format such as PCM. In addition to the audio data stream, media drive 101 also provides the corresponding SACD clocks and control signals. In particular, the audio data are input in response to the serial clock (SCLK) signal, which times the input of each data bit, a left-right clock (LRCK) signal, which times the input of samples of left and right channel stereo data, and a master clock (MCLK), which controls the overall audio processing timing.

The resulting recovered data undergoes digital processing, including digital filtering, in digital audio processing block 102, prior to conversion to analog audio in digital to analog converter (DAC) 103. Amplifier block 104 then drives a set of conventional main speakers 105a and 105b, and a subwoofer 106.

A conventional SACD system drives a pair of full range audio speakers. However, to extend SACD to applications, such as home theater systems, which typically utilize a set of main speakers without extended bass response and an associated subwoofer (e.g., main speakers 105a and 105b, and subwoofer 106 of FIG. 1), crossover filtering is required to direct the low frequency energy to the larger subwoofer (e.g., subwoofer 106 of FIG. 1) and the higher frequency energy to the smaller main speakers (e.g., main speakers 105a and 105b of FIG. 1). Telescopic filters embodying the present inventive principles advantageously allow for such crossover filtering to be performed efficiently at high oversampling rates (e.g., at eight (8) times oversampling and above). Typically, these systems run at 64–44100 Hz sampling rate, or about 2.8 MHz.

All infinite impulse response (IIR) digital filters can be implemented as transpose form filters. Transpose form filters are very similar to the delta-sigma modulators typically used in DACs. In particular, the truncation of the coefficient multiplications performed in IIR filters is mathematically equivalent to the quantization operations of a delta-sigma modulator; the truncation of the results of the multiplication operations performed in an IIR filter add white noise and gain to the output similar to the quantizer in a delta-sigma modulator. Therefore, an IIR filter can be designed in transpose form and the truncation of multiplication operations consolidated in a delta-sigma modulator quantizer such as the noise shaping quantizers discussed above.

Figure 2B:
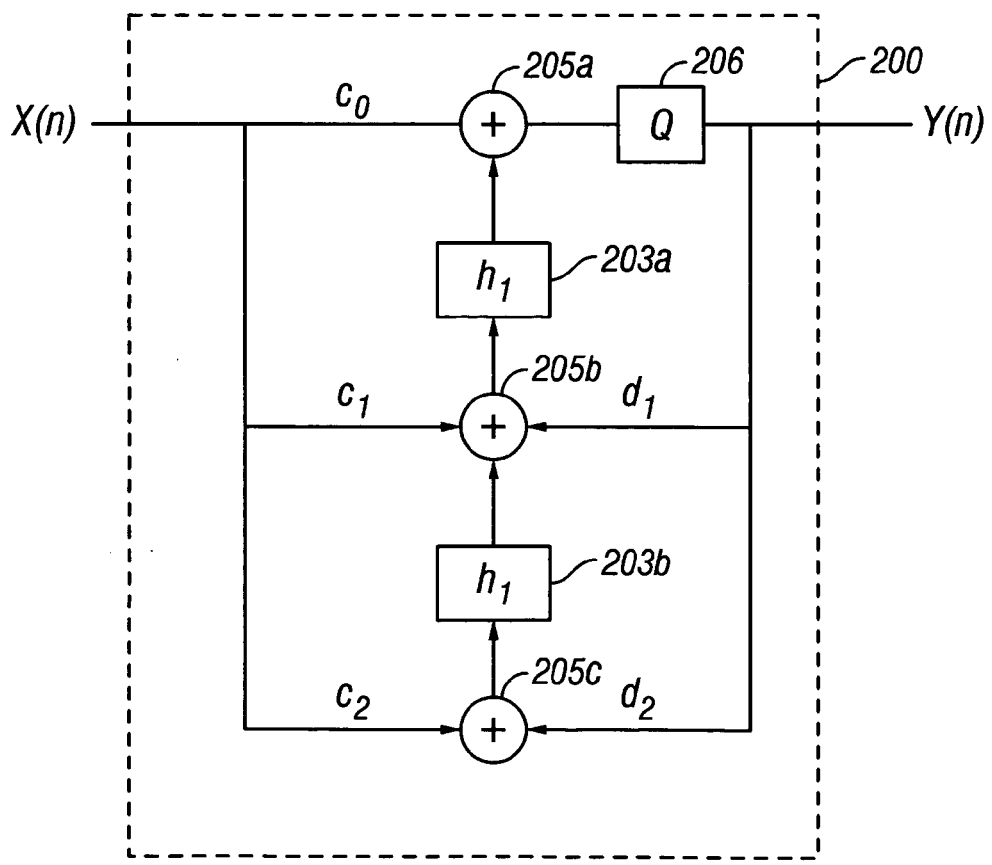
FIG. 2B is a block diagram of the transpose form of the IIR filter shown in FIG. 2A.

In the case of a subwoofer (lowpass) crossover filter according to the inventive principles, a lowpass filter is designed in transpose form, the typical IIR delay elements are replaced with delaying integrators (e.g., having a transfer function of $z^{-1}/(1-z^{-1})$) and the normal truncation operations are replaced with a simple delta-sigma modulator, such as a second order, five-bit delta-sigma modulator. This process is illustrated in FIGS. 2A–2B. The replacement of delays by integrators affects a conformal mapping on the z-plane that further reduces the need for accurate coefficients and hence accurate multipliers. For a discussion of filter accuracy effects, see, for example, Roberts and Mullis, *Digital Signal Processing*, Addison-Wesley Publishing Company, 1987.

FIG. 2A is a block diagram of a generalized direct form of an IIR filter 200. Filter 200 is a second order IIR filter including a set of delays 201a–201d and a summer 202 which sums the output of each delay stage 201a–201d after multiplication by a corresponding coefficient $a_0$–$a_2$ or $b_1$–$b_2$. A quantizer 206 reduces the number of bits generated by the multiplication operations applying coefficients $a_1$–$a_2$ and $b_1$–$b_2$ to the input data stream x(n). Filter 200 is shown in the equivalent transpose form in FIG. 2B, in which filter stages 203a–203b implement the function $h_1=Z^{-1}$. The coefficients in the transpose form become $c_0$–$c_1$, $c_2$ and $d_1$,-$d_2$. The transpose form of filter 200 utilizes three summers 205a–205c and quantizer 206. Conversion of a direct form IIR filter into transpose form is described in digital signal processing texts such as Proakis and Manolakis, *Digital Signal Processing Principles, Algorithms and Applications*, Prentice-Hall, (1996).

Figure 2C:
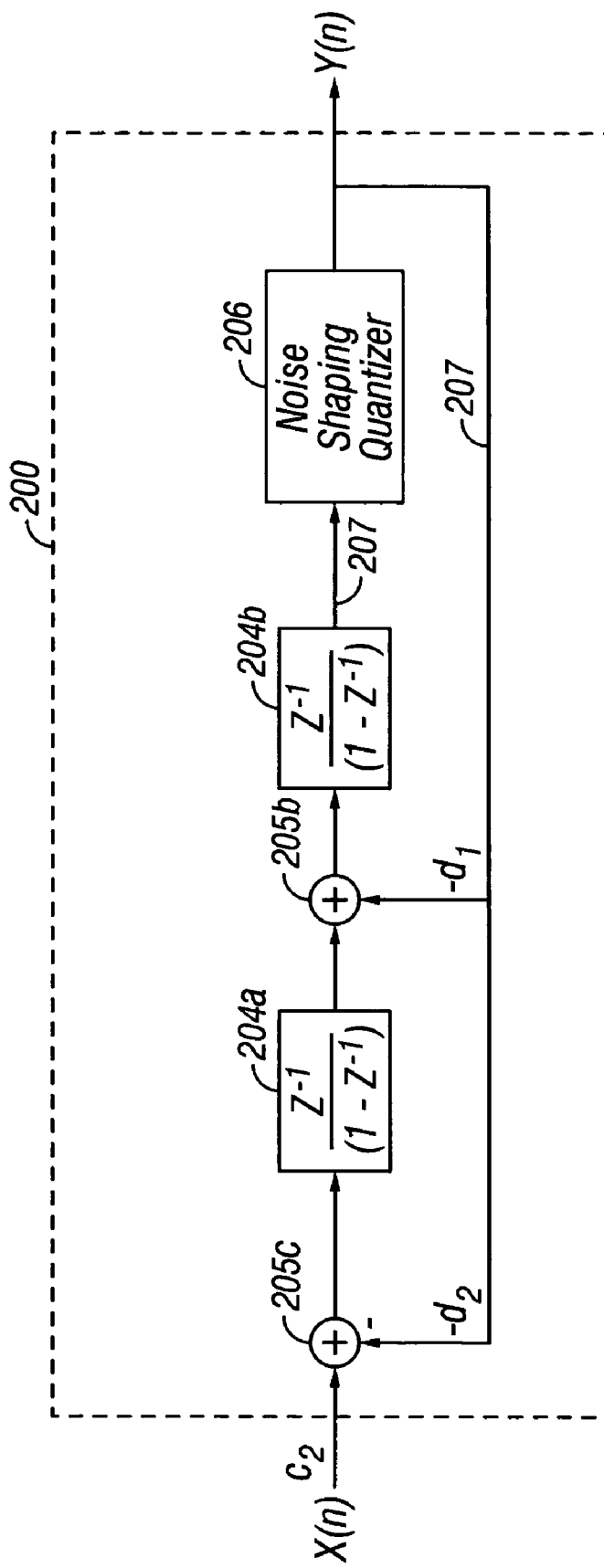
FIG. 2C is a lowpass feedback filter with a noise shaping quantizer output stage according to the principles of the present invention and suitable for use in the digital audio processing block shown in FIG. 1.

As shown in FIG. 2C, if stages 203a and 203b of the transpose form filter of FIG. 2B, are replaced with respective delaying integrators 204a and 204b with a function $Z^{-1}(1-Z^{-1})$, the coefficients $c_0$, and $c_1$ are set to zero, and quantizer 206 is a noise shaping quantizer, as discussed below, then filter 200 takes on the topology shown in FIG. 2C, which is essentially the topology of a feedback delta-sigma modulator. Specifically, filter 200 now includes a pair of delaying integrator stages 204a and 204b and associated input summers 205b and 205c which implement the feed forward coefficient $c_2$ and the feedback coefficients $-d_2$ and $-d_1$ in feedback path 207. The truncation of the results of the multiplications by the digital stream by coefficients $c_2$, $-d_2$ and $d_1$ is now performed in noise shaping quantizer 206, which has a relatively flat signal-to-transfer function (STF) and a low order topology. Because noise shaping quantizer 206 noise shapes out-of-band noise to higher frequencies, the number of bits which must be fed-back to summers 205b and 205c can be advantageous and relatively small (e.g., 5–8 bits for audio systems, assuming $2^{nd}$ order noise shaping). In turn, the multiplications by feedback coefficients $-d_2$ and $-d_1$ are relatively easy to implement in either hardware of software. the frequency response of this configuration of filter 200 is all-pole, which is appropriate for low pass filters. By selling the coefficients $c_1$ and $c_2$ of FIG. 2B to non-zero values, other filter configurations with noise shaping quantizers result.

Figure 3:
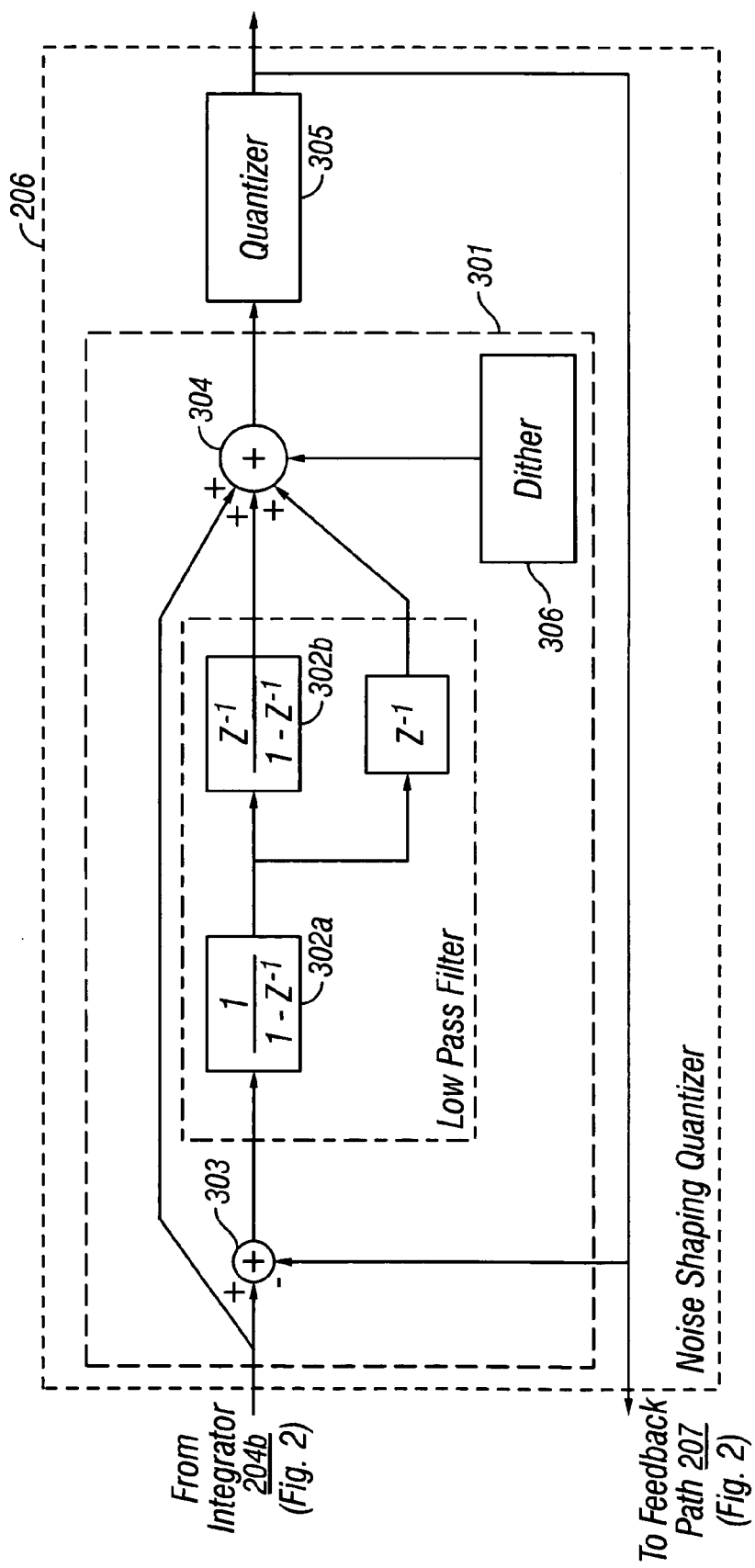
FIG. 3 is a block diagram of an exemplary embodiment of the noise shaping quantizer shown in FIG. 2C.

FIG. 3 is a block diagram of an exemplary feedforward embodiment of noise shaping quantizer 206. Generally, quantizer loop filter 301 has a constant signal transfer function (STF) of approximately 1 (i.e., a generally flat response across a wide frequency band) and a noise transfer function (NTF) selected to noise shape the quantization noise created by quantizer 305. Quantizer 305 is normally a traditional numeric truncation quantizer, although further telescoping of noise shaping quantizers is possible. Optional dither source 306 guarantees that the quantization noise remains non-tonal. In the embodiment of noise shaping quantizer 206 shown in FIG. 3, the NTF is $(1+Z^{-1})^2$ which generates two co-located NTF zeros at the Nyquist frequency. In alternate embodiments, the NTF and the location of the NTF zeros may vary depending on the desired noise shaping. In the illustrated embodiment, the STF is identically 1.

Exemplary quantizer loop filter 301 includes a pair of integrator stages 302a–302b, an input summer 303 and an output summer 304. The direct input from filter stage 204b of FIG. 2C, the output from first integrator stage 302a and the output from second integrator stage 302b are summed into the input of quantizer 305 by summer 304. Quantizer 305 truncates the output from summer 304 and provides noise shaped feedback to noise shaping quantizer input summer 303 and feedback path 207 of FIG. 2C. As a result of the noise shaping in quantizer loop filter 301, the number of output bits from quantizer 305 is relatively small, around five (5) bits for audio applications. The topology of FIG. 3 is telescoped by utilizing a noise shaping quantizer, including a loop filter and another quantizer, for the sub-topology of quantizer 305.

Figure 4:
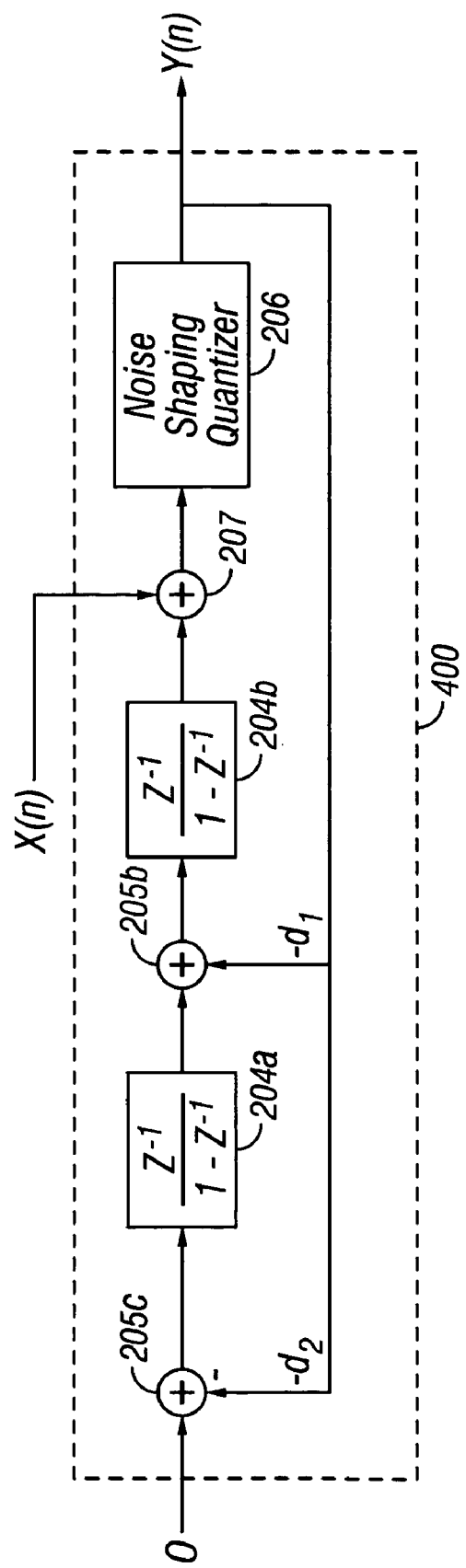
FIG. 4 illustrates a highpass feedback filter with a noise shaping quantizer output stage according to the principles of the present invention and suitable for use in the digital audio processing block shown in FIG. 1.

Filter 200, as ultimately depicted in FIG. 2C, works very well in lowpass filter applications, such as a subwoofer crossover filter. However, application of the same principles to higher frequency filters, such as the highpass crossover filters necessary to filter low frequency energy from the inputs to main speakers 105a and 105b of FIG. 1, requires an additional modification. FIG. 4 illustrates a high pass filter 400 suitable for such applications. In filter 400, the primary input is set to a constant such as zero. The digital input signal X(n) is injected between the primary loop filter composed of delayed integrators 204a and 204b and noise shaping quantizer 206. The input signal X(n) is shaped like noise (i.e., high passed) by the outer delta-sigma loop between the output of noise shaping quantizer 206 and the feedback inputs to summers 205a and 205b. This filter has a double zero at dc, appropriate for many high-pass filters. While low-pass filter 200 will remove the high frequency out-of-band noise in the highly oversampled input signal (n), high-pass filter 400 will not remove this out-of-band noise present in the audio input signal, and therefore a lowpass filter could be required at the output of highpass filter 400, such as a filter with a corner frequency of around 50 kHz.

The principles of the present invention can be extended to multiple telescoped filters and delta-sigma modulators. For example, the same process described above with respects to FIGS. 2A–2C may be used to characterize noise shaping quantizer 206 (FIG. 2C). In such a double-telescoped embodiment, the quantizer of noise shaping quantizer 206 includes a third noise shaping loop including a loop filter and truncator (quantizer). This process may be repeated to further telescope the output of the modulator or filter system to triple-telescoped embodiments and beyond.

Figure 5:
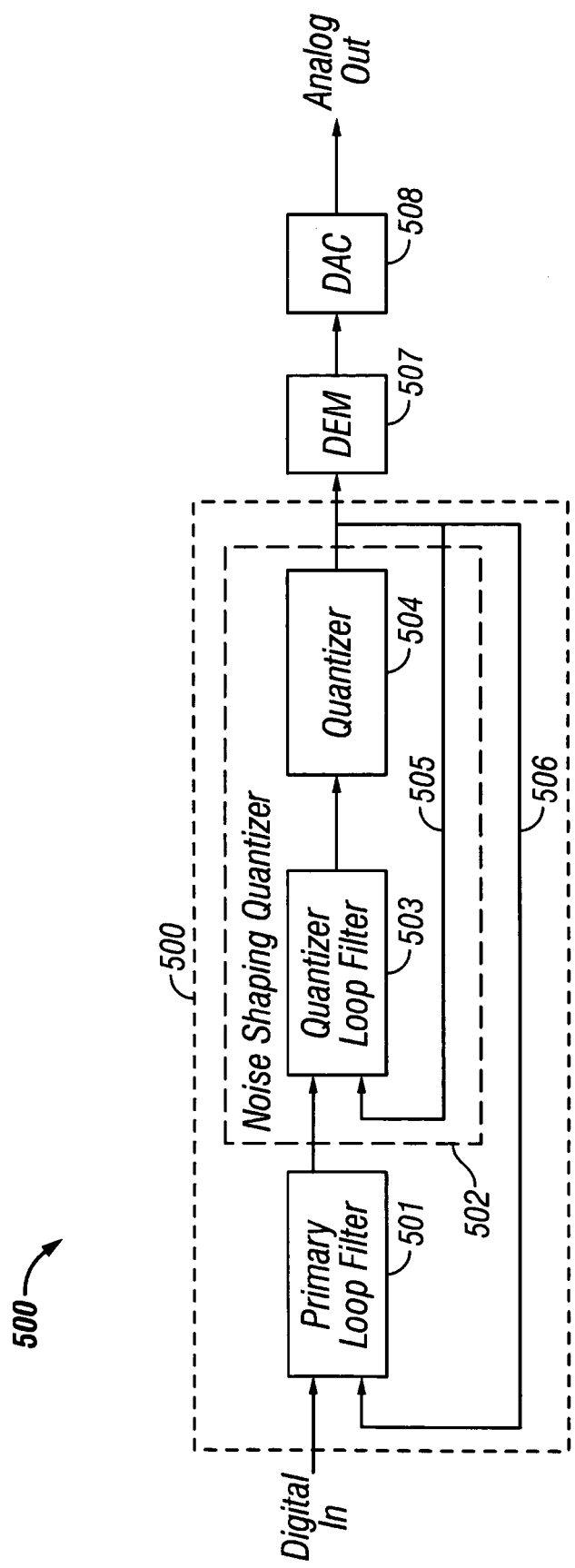
FIG. 5 is a block diagram illustrating an exemplary delta-sigma data converter with telescoped quantizer according to the principles of the present invention and suitable for use in the digital to analog converter (DAC) subsystem of FIG. 1.

FIG. 5 is a block diagram illustrating an exemplary delta-sigma data converter 500 suitable for use in DAC 103 shown in FIG. 1. According to the principles of the present invention, DAC 500 includes a telescoped delta-sigma modulator 510 with a primary loop filter 501 and a noise shaping quantizer 502. Noise shaping quantizer 502 is generally a second delta-sigma modulator including a quantizer loop filter 503 and a quantizer 504. Quantizer 504 in telescoped delta-sigma modulator 500 provides noise shaped feedback to both quantizer loop filter 503 through inner feedback loop 505 and to primary loop filter 501 through outer feedback loop 506. Advantageously, since the feedback from quantizer 504 is noise shaped, the number of feedback bits to primary loop filter 501 and/or quantizer loop filter 503 can be significantly reduced while still maintaining sufficient attenuation in the data converter noise transfer function (NTF) baseband. Furthermore, telescoped modulator 500 can be further telescoped by utilizing a second noise shaping quantizer as quantizer 504 of noise shaping quantizer 502. Representative topologies suitable for implementing telescoped delta-sigma modulator 500 is described further below in conjunction with FIGS. 6 and 7.

DAC subsystem 103 also includes dynamic element matching (DEM) logic 507, which applies a re-routing algorithm to the output bits from puantizer 504 to account for mismatch errors between elements of following output DAC 508. Output DAC 508 is preferably a conventional switched capacitor or current-steering DAC.

Figure 6:
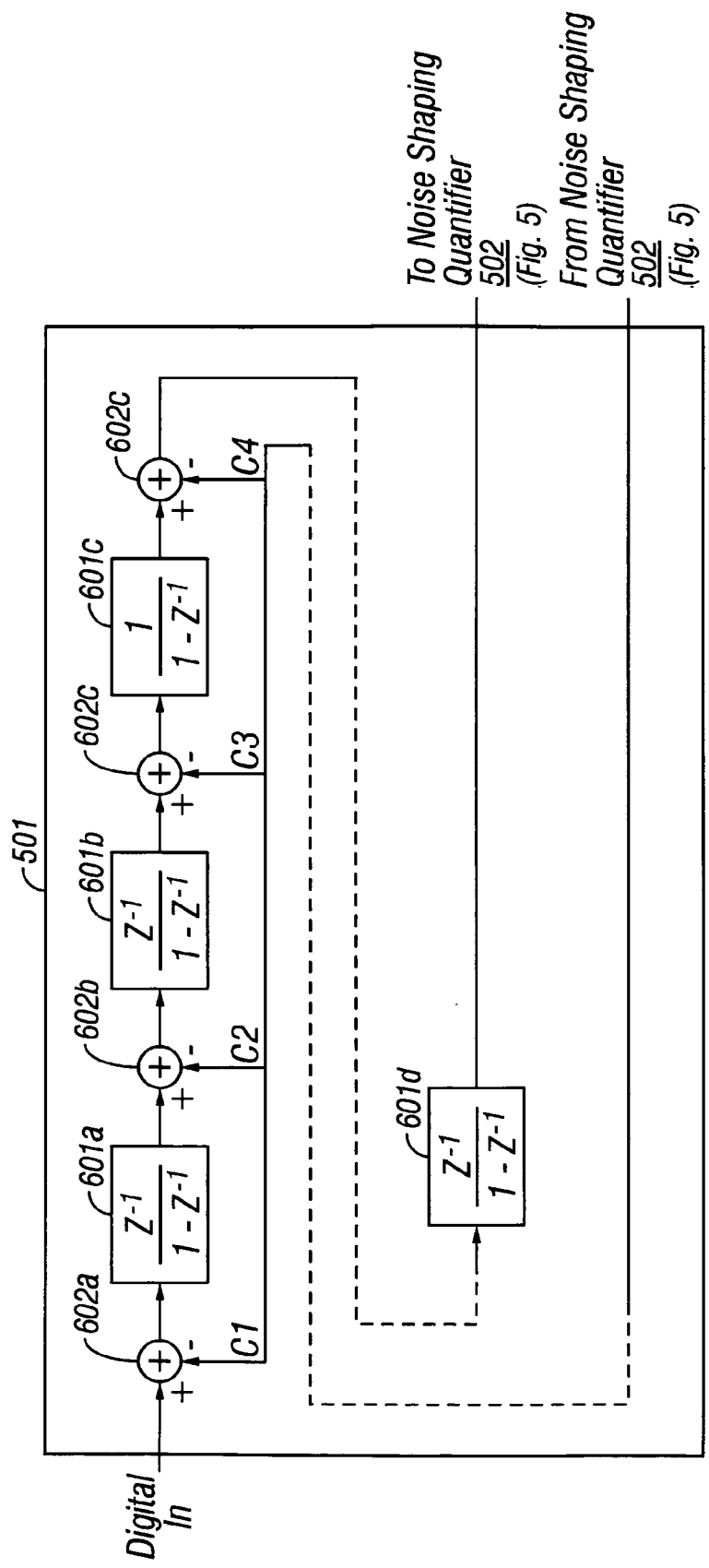
FIG. 6 is a representative topology for the primary loop filter shown in FIG. 5.

FIG. 6 depicts a representative topology for primary loop filter 501 of FIG. 5. In the embodiment shown in FIG. 6, primary loop filter 501 is a fourth ($4^{th}$) order distributed feedback delta-sigma loop filter based on four (4) integrator stages 601a–601d, including delaying integrators 601a, 601b, and 601d, and non-delaying integrator 601c, and associated summers 602a–602d. The feedback coefficients c1–c4 are selected to provide the required filter NTF and signal transfer function (STF). The loop-filter equations and corresponding NTFs and STFs for distributed feedback loop filters, as well as for alternate filter topologies suitable for practicing the inventive principles, can be derived from the discussions of Norsworthy et al., *Delta-Sigma Converters, Theory, Design and Simulation,* IEEE Press (1997).

Figure 7:
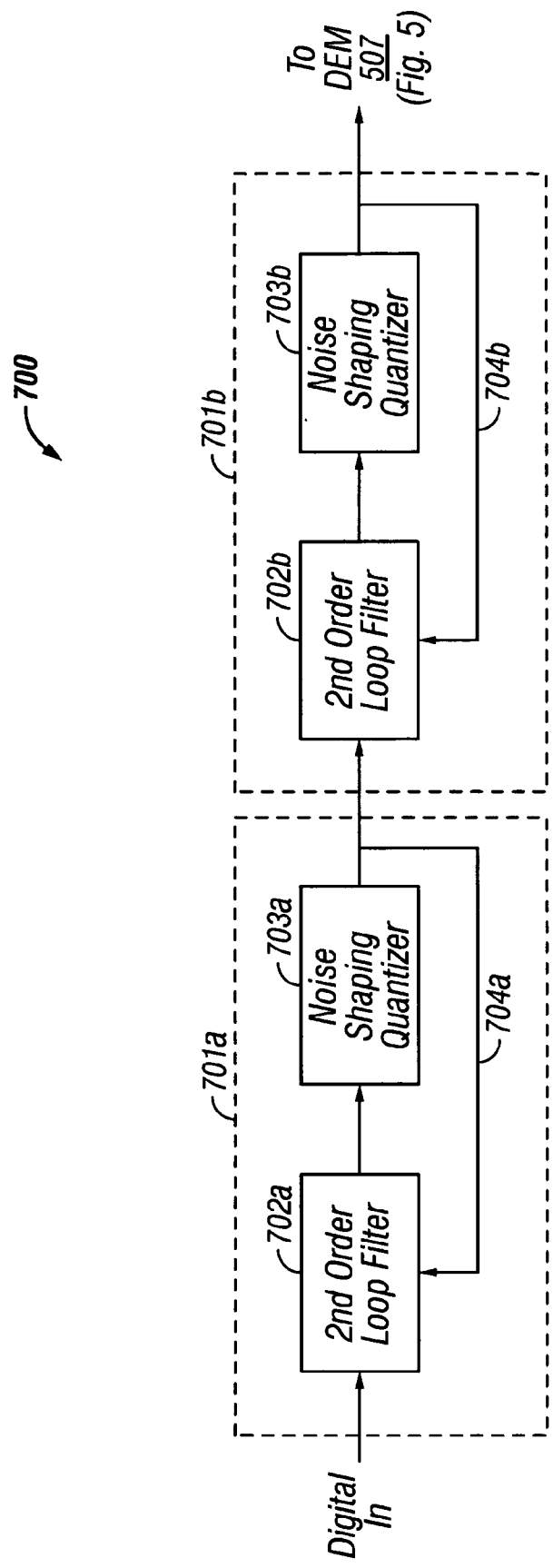
FIG. 7 is an exemplary cascaded delta-sigma modulator topology with noise shaping quantizers according to the principles of the present invention.

The principles of the present invention are equally applicable to cascaded delta-sigma modulators topologies, such as delta-sigma modulator topology 700 shown in FIG. 7. Delta-sigma modulator topology 700 is based on two cascaded delta-sigma modulator stages 701a and 701b. Each modulator stage 701a–701b includes a corresponding loop second ($2^{nd}$) order loop filter 702a/702b, a noise shaping quantizer 703a/703b, and a feedback loop 704a/704b. Noise shaping quantizers 703a–703b, in the illustrated embodiment, utilize topology 206 discussed above in conjunction with FIG. 2. In alternate embodiments, the number of cascaded delta-sigma modulator stages 701a–701b, and/or the order of loop filters 702a–702b will vary, depending on the desired noise and signal transfer functions.

In sum, the present principles provide for the implementation of efficient filters, such as IIR filters, and noise shapers (delta-sigma modulators). Generally, an outer noise shaping loop operates as a filter having a given filter response. An inner noise shaping loop performs noise shaping in the feedback path of the outer noise shaping loop. By using a high oversampling rate, the inner noise shaping loop translates noise in the outer loop output signal to much higher frequencies, such that fewer feedback bits are required in the outer loop feedback path to achieve full feedback accuracy. Fewer feedback bits result in a feedback system, in either hardware or software, with multipliers and adders of fewer numbers of bits.

Filters according to the principles of the present invention have a number of advantageous applications. For example, digital lowpass and highpass audio filters are realistically implemented with a minimum of hardware and/or software. Audio filtering normally performed in the analog domain is now performed in the digital domain. In turn, audio formats, such as the SACD format, can be extended to multiple-speaker audio systems, including audio systems utilizing main and subwoofer speakers.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A noise shaping system, comprising:
   an inner noise shaping loop filter having a substantially constant signal transfer function across a broad band including:
   an inner loop filter; and
   a quantizer for quantizing an output of the inner loop filter; and
   an outer noise shaping loop including an outer loop filter having an input receiving feedback from the quantizer of the inner noise shaping loop and an output driving an input of the inner loop filter of the inner noise shaping loop.

2. The noise shaping system of claim 1 wherein the outer noise shaping loop further includes an input stage for receiving an input signal being noise shaped.

3. The noise shaping system of claim 1 further comprising an input for injecting an input signal between an output of the outer loop filter and an input of the inner loop filter.

4. The noise shaping system of claim 1 wherein the outer loop filter comprises a feedback delta-sigma loop filter.

5. The noise shaping system of claim 1 implementing an infinite impulse response filter wherein multiplication truncation n performed within the quantizer of the inner noise shaping loop.

6. The noise shaping system of claim 1 wherein the quantizer of the inner loop filter comprises a noise shaping quantizer comprising:
a second inner loop filter; and
a truncator.

7. A method of noise shaping comprising:
filtering signal with first filter;
noise shaping an output of the first filter with an inner noise shaping loop having a substantially constant signal transfer function across a broad band, the noise shaping loop including a second filter and a quantizer; and
feeding-back a noise shaped signal output from the inner noise shaping loop to the first filter with an outer noise shaping loop.

8. The method of claim 7 wherein noise shaping with an inner noise shaping loop comprises filtering with a second filter having a substantially flat signal transfer function.

9. The method of claim 7 wherein:
filtering a signal with a first filter comprises implementing infinite impulse response filter multiplication and delay operations; and
noise shaping comprises implementing infinite impulse response filter multiplication truncation operation in the quantizer.

10. The method of claim 7 comprising inputting a signal into an input of the first filter to implement a low pass response.

11. The method at claim 7 further comprising inputting a signal between an output of the first filter and an input of the second filter to implement a high pass response.

12. The method of claim 11 further comprising inputting a constant into an input of the first filter.

13. The method of claim 7 further comprising implementing a dynamic element matching process on an output of the quantizer.

14. The method of claim 7 wherein noise shaping comprises:
quantizing an output of the second filter in a noise shaping quantizer including a third filter and a truncator.

15. An infinite impulse response filter comprising:
at least one filter stage; and
a filter feedback coupling an input of the filter and an output of the at least one filter stage, the filter feedback including a noise shaping quantizer comprising a delta-sigma modulator including at least one modulator filter stage, a modulator quantizer, and a modulator feedback loop coupling an output of the modulator quantizer and an input of the modulator filter stage, wherein the filter feedback has a signal transfer function which is substantially flat across a wide frequency band.

16. The filter of claim 15 wherein the at least one filter stage comprises at least one integrator stage.

17. The filter of claim 15 further comprising a digital to analog converter coupled to an output of the filter.

18. The filter of claim 15 wherein the filter comprises a subwoofer filter for driving a subwoofer speaker.

19. The filter of claim 15 wherein the filter comprises a high-pass filter to drive high frequency speaker.

20. The filter of claim 15 wherein the filter receives a stream of single-bit audio input data.

* * * * *